(12) United States Patent
Fox et al.

(10) Patent No.: US 8,003,070 B2
(45) Date of Patent: Aug. 23, 2011

(54) METHODS FOR FORMING PARTICLES FROM SINGLE SOURCE PRECURSORS

(75) Inventors: Robert V. Fox, Idaho Falls, ID (US); Rene G. Rodriguez, Pocatello, ID (US); Joshua Pak, Pocatello, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 538 days.

(21) Appl. No.: 12/047,956

(22) Filed: Mar. 13, 2008

(65) Prior Publication Data

US 2009/0233398 A1 Sep. 17, 2009

(51) Int. Cl.
*C01B 17/00* (2006.01)
*C01B 19/00* (2006.01)

(52) U.S. Cl. ...... 423/508; 423/509; 423/511; 423/561.1; 423/566.1; 423/566.2; 977/813; 977/824

(58) Field of Classification Search .......... 423/508, 423/509, 511, 561.1, 566.1, 566.2; 977/813, 977/824

See application file for complete search history.

(56) References Cited

U.S. PATENT DOCUMENTS

| | | | |
|---|---|---|---|
| 4,687,881 A | 8/1987 | Goslowsky et al. | |
| 4,906,290 A | 3/1990 | Worner | |
| 5,445,847 A | 8/1995 | Wada et al. | |
| 5,501,786 A | 3/1996 | Gremion et al. | |
| 5,567,469 A * | 10/1996 | Wada et al. ............ | 427/74 |
| 5,858,120 A | 1/1999 | Nakagawa et al. | |
| 6,127,202 A | 10/2000 | Kapur et al. | |
| 6,145,342 A | 11/2000 | Bayya et al. | |
| 6,307,148 B1 | 10/2001 | Takeuchi et al. | |
| 6,355,874 B1 | 3/2002 | Yagi et al. | |
| 6,429,369 B1 | 8/2002 | Tober et al. | |
| 6,875,661 B2 | 4/2005 | Mitzi | |
| 6,992,201 B2 | 1/2006 | Scholz et al. | |
| 6,992,202 B1 | 1/2006 | Banger et al. | |
| 7,351,282 B2 | 4/2008 | Yamaguchi | |
| 7,575,699 B2 | 8/2009 | Strouse et al. | |
| 7,615,169 B2 | 11/2009 | Strouse | |
| 7,892,519 B2 | 2/2011 | Pak et al. | |
| 2003/0226498 A1 | 12/2003 | Alivisatos et al. | |
| 2004/0126485 A1 | 7/2004 | Thompson et al. | |
| 2005/0133087 A1 | 6/2005 | Alivisatos et al. | |
| 2005/0183767 A1 | 8/2005 | Yu et al. | |
| 2005/0271827 A1 | 12/2005 | Krunks et al. | |
| 2006/0159611 A1 | 7/2006 | Hummelen et al. | |
| 2007/0209700 A1 | 9/2007 | Yonezawa et al. | |
| 2008/0012015 A1 | 1/2008 | Shim et al. | |
| 2008/0026929 A1 | 1/2008 | Jensen et al. | |

OTHER PUBLICATIONS

Gardner et al., "Rapid synthesis and size control of CuInS2 semiconductor nanoparticles using microwave irradiation," J. Nanoparticle Research 2008, 10(4), pp. 633-641.

(Continued)

*Primary Examiner* — Timothy C Vanoy
(74) *Attorney, Agent, or Firm* — TraskBritt (57) ABSTRACT

Single source precursors are subjected to carbon dioxide to form particles of material. The carbon dioxide may be in a supercritical state. Single source precursors also may be subjected to supercritical fluids other than supercritical carbon dioxide to form particles of material. The methods may be used to form nanoparticles. In some embodiments, the methods are used to form chalcopyrite materials. Devices such as, for example, semiconductor devices may be fabricated that include such particles. Methods of forming semiconductor devices include subjecting single source precursors to carbon dioxide to form particles of semiconductor material, and establishing electrical contact between the particles and an electrode.

20 Claims, 3 Drawing Sheets

OTHER PUBLICATIONS

Hirpo et al., J. Am. Chem. Soc. 1993, vol. 115, pp. 1597-1599.
Nairn et al., "Preparation of Ultrafine Chalcopyrite Nanoparticles via the Photochemical Decomposition of Molecular Single-Source Precursors," Nano Letters 2006, vol. 6(6), pp. 1218-1223.
Rodriguez et al., "The Formation of Copper Indium Disulfide Nano-Particles in Supercritical Carbon Dioxide," NORM 2007, American Chemical Society, The 62nd Northwest Regional Meeting, Boise, Idaho, Jun. 17-20, 2007, 5 pages.
PCT International Search Report and Written Opinion of the International Searching Authority for PCT/US09/36221, dated Nov. 2, 2009, 11 pages.
Connor et al., "Phase Transformation of Biphasic CuS#CuInS to Monophasic CuInS Nanorods," J. Am. Chem. Soc, 2009, 131 (13), 4962-4966.
Banger et al., "A review of single source precursors for the deposition of ternary chalcopyrite materials," NASA Conference Publication (2002), 17th Space Photovoltaic Research and Technology Conference, 2001, pp. 115-125.
Deniozou et al., "Surface structure of CuGASe2 (001)" Thin Solid Films 480-481 (2005) 382-387.
Halgand et al., "Physico-chemical characterisation of Cu(In,Al)Se2 thin film for solar cells obtained by a selenisation process," Thin Solid Films 480-481 (2005) 443-446.
Jin et al., "Solar cells fabricated with CuInS2 films deposited using single-source precursors," Proceedings of the 19th European Photovoltaic Solar Energy Conference, 4AV.1.71, 2004.
Liu et al., "Preparation and characterization of CuInS2 thin films completely converted from CuInSe2 by sulfurization," Thin Solid Films 480-481 (2005) 50-54.
Narako et al., "Synthesis of Metastable Wurtzite CuInSe2Nanocrystals," Chem. Mater. 2010, 22, 1613-1615.
Pan et al., "Synthesis of Cu-In-S Ternary Nanocrystals with Tunable Structure and Composition," J. Am. Chem. Soc. Apr. 30, 2008; 130(17):5620-1, Epub Apr. 9, 2008.
Qi et al., "Synthesis and Characterization of Nanostructured Wurtzite CuInS2: A New Cation Disordered Polymorph of CuInS2," J. Phys. Chem. C 2009, 113, 3939-3944.
Sun et al., "A High-Yield Synthesis of Chalcopyrite CuInS2 Nanoparticles with Exceptional Size Control," Journal of Nanomaterials, vol. 2009, Article ID 748567, 7 pages.
Wang et al., "Synthesis of Monodispersed Wurtzite Structure CuInSe2 Nanocrystals and Their Application in High-Performance Organic-Inorganic Hybrid Photodetectors," J. Am. Chem. Soc., 2010, 132 (35), pp. 12218-12221.
Rodriguez, et al., "Pulsed-Spray Radiofrequency Plasma Enhanced Chemical Vapor Deposition of CUInS2 Thin Films," Plasma Chemistry and Plasma Processing, vol. 26, No. 2, Apr. 2006, pp. 137-148.
International Search Report for International Application No. PCT/US10/60583, mailed Mar. 21, 2011, 2 pages.
Written Opinion of the International Searching Authority for International Application No. PCT/US10/60583, mailed Mar. 21, 2011, 6 pages.
Bahnemann, D. W., "Ultrasmall Metal Oxide Particles: Preparation, Photophysical Characterization, and Photocatalytic Properties". Israel J. Chem., 1993, pp. 115-136, vol. 33.
Banger, K.K., et al., "Synthesis and Characterization of the First Liquid Ssingle-Source Precursors for the Deposition of Ternary Chalcopyrite (CuInS(2)) Thin Film Materials," Chem. Mater., 2001, pp. 3827-3829, vol. 13.
Banger, K.K., et al., "Facile modulation of single source precursors: the synthesis and characterization of single source precursors for deposition of ternary chalcopyrite materials," Thin Solid Films, 2002, pp. 390-395, vol. 403-404.
Banger, K.K., et al., "A New Facile Route for the Preparation of Single-Source Precursors for Bulk, Thin-Film, and Nanocrystallite I-III-VI Semiconductors," Inorg. Chem., 2003, pp. 7713-7715, vol. 42, No. 24.
Cardellicchio, N., et al., "Optimization of Microwave Digestion for Mercury Determination in Marine Biological Samples by Cold Vapour Atomic Absorption Spectrometry", Annali di Chimica, 2006, pp. 159-165, vol. 96 (3-4).
Carro, N., et al., "Microwave-assisted solvent extraction and gas chromatography ion trap mass spectrometry procedure for the determination of persistent organochlorine pesticides (POPs) in marine sediment", Anal. Bioanal. Chem., 2006, pp. 901-909, vol. 385.
Castro, S.L., et al., "Nanocrystalline Chalcopyrite Materials (CuInS(2)), and CuInSe(2)) via Low-Temperature Pyrolysis of Molecular Single-Source Precursors", Chem. Mater., 2003, pp. 3142-3147, vol. 15.
Castro, S.L., et al., "Synthesis and Characterization of Colloidal CuInS(2) Nanoparticles from a Molecular Single-Precursor," J Phys Chem B., 2004, pp. 12429-12435, vol. 108.
Choi, S.H., et al., "One-Pot Synthesis of Copper-Indium, Sulfide Nanocrystal Heterostructures with Acorn, Bottle, and Larva Shapes," J. Am Chem Soc., 2006, pp. 2520-2521, vol. 128 (8).
Domini, C.E, et al., "Comparison of three optimized digestion methods for rapid determination of chemical oxygen demand: Closed microwaves, open microwaves and ultrasound irradiation," Analytica Chimica Acta., 2006, pp. 210-217, vol. 561.
Dutta, D.P., et al., "A facile route to the synthesis of CuInS(2) nanoparticles," Materials Letters, 2006, pp. 2395-2398, vol. 60.
Gamallo-Lorenzo, D., et al., "Microwave-assisted alkaline digestion combined with microwave-assisted distillation for the determination of iodide and total iodine in edible seaweed by catalytic spectrophotometry," Analytica Chimica Acta., 2005, pp. 287-295, vol. 542.
Garcia-Vidal, J.A., et al., "Green chemistry: Efficient epoxides ring-opening with l-butanol under microwave irradiation," Applied Surface Science, 2006, pp. 6064-6066, vol. 252 (17).
Gratzel, M., "Perspectives for Dye-sensitized Nanocrystalline Solar Cells," Progress in Photovoltaics: Research and Applications, 2000, pp. 171-185, vol. 8.
Grisaru, H, et al., "Microwave-Assisted Polyol Synthesis of CuInTe(2) and CuInSe(2) Nanoparticles," Inorg. Chem., 2003, pp. 7148-715542, vol. 42.
Hayes, B.L., "Recent Advances in Microwave-Assisted Synthesis," Aldrichimica Acta., 2004, pp. 66-77, vol. 37 No. 2.
Huynh, W.U., et al., "CdSe Nanocrystal Rods/Poly (3-hexylthiophene) Composite Photovoltaic Devices," Advanced Materials, 1999, pp. 923-927, vol. 11 No. 11.
Huynh, W.U., et al., "Hybrid Nanorod-Polymer Solar Cells," Science, 2002, pp. 2425-2427, vol. 295.
Luque, A., et al., "Increasing the Efficiency of Ideal Solar Cells by Photon Induced Transitions at Intermediate Levels," Physical Review Letters, 1997, pp. 5014-5017, vol. 78 No. 26.
Marcinkevicius, S., et al., "Changes in carrier dynamics induced by proton irradiation in quantum dots," Physica. B, Condensed Matter, 2002, pp. 203-206, vol. 314.
Murali, A., et al., Synthesis and Characterization of Indium Oxide Nanoparticles, Nano Letters, 2001, pp. 287-289, vol. 1, No. 6.
Navarro, P., et al., "Optimisation of microwave assisted digestion of sediments and determination of Sn and Hg," Analytica Chimica Acta, 2006, pp. 37-44, vol. 566.
Nüchter, M., et al., "Microwave-Assisted Chemical Reactions," Chem. Eng. Technol., 2003, 1207-1216, vol. 26 (12).
Nüchter, M., et al., "Microwave Assisted Synthesis-a critical technology overview," Green Chem., 2004, pp. 128-141, vol. 6 (3).
Pak, J.J., et al., "An efficient synthesis of 4, 4',5,5'-tetraiododibenzo-24-crown-8 and its highly conjugated derivatives," Tetrahedron Letters, 2005, pp. 233-237, vol. 47.
Perozo-Rondon, E., et al., "Microwave enhanced synthesis of N-propargyl derivatives of imidazole A green approach for the preparation of fungicidal compounds," Applied Surface Science, 2006, pp. 6067-6070, vol. 252 (17).
Sobolev, N. A., et al., "Enhanced Radiation Hardness of InAs/GaAs quantum Dot Structures," Phys. Stat. Sol. (B), 2001, pp. 93-96, vol. 224, No. 1.
Tang, Z., et al., "Semiconductor Nanoparticles on Solid Substrates: Film Structure, Intermolecular Interactions, and Polyelectrolyte Effects," Langmuir, 2002, pp. 7035-7740, vol. 18.
Walters, R.J., et al., "Radiation Hard Multi-quantum Well InP/InAsP Solar Cells for Space Applications,"Progress in Photovoltaics: Research and Applications, 2000, pp. 349-354, vol. 8.

Wang, Y., et al., "Nanometer-Sized Semiconductor Clusters: Materials Synthesis, Quantum Size Effects, and Photophysical Properties," J. Phys. Chem., 1991, pp. 525-532, vol. 95.

Wei, Q., et al., "Synthesis of CuInS(2) Nanocubes by a Wet Chemical Process," Journal of Dispersion Science and Technology, 2005, pp. 555-558, vol. 26.

Zhang, X., et al., "Applications of microwave dielectric heating in environment-related heterogeneous gas-phase catalytic systems," Inorganica Chimica Acta, 2006, pp. 3421-3433, vol. 359.

Zhu, J., et al., "Microwave assisted preparation of CdSe, PbSe, andCU2-x Se nanoparticles," J. Phys. Chem. B., 2000, 104 (31), 7344-7347.

Tomalia, D.A., "Birth of a New Macromolecular Architecture: Dendrimers as Quantized Building Blocks for Nanoscale Synthetic Organic Chemistry," Aldrichimica ACTA, 2004, pp. 39-57, vol. 27, No. 2.

Gerbec, J.A., et al., "Microwave-Enhanced Reaction Rates for Nanoparticle Synthesis," J. Am. Chem. Soc., 2005, pp. 15791-15800, vol. 127.

Kim, K, et al., "Synthesis of CuInSe(2) and CuInGaSe(2) Nanoparticles by Solvothermal Route," Materials Science Forum, 2004, pp. 273-276, vols. 449-452.

* cited by examiner

METHODS FOR FORMING PARTICLES FROM SINGLE SOURCE PRECURSORS

GOVERNMENT RIGHTS

This invention was made with government support under Contract Number DE-AC07-05ID14517 awarded by the United States Department of Energy. The government has certain rights in the invention.

TECHNICAL FIELD

Embodiments of the invention relate to methods for forming particles (e.g., nanoparticles) and to methods for forming semiconductor devices using nanoparticles. Additional embodiments of the invention relate to systems for forming nanoparticles, and to semiconductor devices formed using nanoparticles.

BACKGROUND

Semiconductor devices are devices that employ semiconductor materials, which are solid materials that exhibit an electrical conductivity lying between that of a conductor and that of an insulator. Semiconductor devices include, for example, diodes (e.g., light emitting diodes (LEDs)), photovoltaic devices, sensors, solid-state lasers, and integrated circuits (e.g., memory modules and microprocessors).

Photovoltaic devices are semiconductor devices that convert photons (e.g., light) into electricity. For example, solar panels include photovoltaic devices that convert sunlight (i.e., photons originating from the sun) into electricity. Due to the ever-increasing demand for renewable energy sources, the market for photovoltaic devices has experienced an average annual growth rate of about twenty-five percent (25%) over the previous decade.

Extensive research and development has resulted in photovoltaic materials and devices that are cheaper and more efficient. The cost of power produced by photovoltaic devices has decreased significantly over the past several decades, but must be further reduced to become competitive with alternative power sources, such as coal.

A majority of photovoltaic devices that are commercially available at the present time comprise photodiodes formed in silicon substrates. The performance of such silicon-based photovoltaic devices, is however, inherently limited by physical and chemical properties of silicon. New photovoltaic devices have been created that are based on light-absorbing materials (which may be either organic or inorganic) other than silicon. The number of non-silicon-based photovoltaic devices has steadily increased over the previous two (2) decades and currently accounts for more than ten percent (10%) of the solar energy market. Non-silicon photovoltaic devices are expected to eventually replace a large portion of the market for silicon-based photovoltaic devices and to expand the solar energy market itself due to their material properties and efficient power generating ability. In order for solar power to be economically competitive with alternative fossil fuel power sources at their current prices, photovoltaic devices based on photoactive materials other than silicon must be improved and further developed.

Materials other than silicon that can be employed in photovoltaic devices include, for example, germanium (Ge), chalcopyrites (e.g., $CuInS_2$, $CuGaS_2$, and $CuInSe_2$), chalcogenides [$Cu(In_xGa_{1-x})(Se_xS_{1-x})_2$], cadmium telluride (CdTe), gallium arsenide (GaAs), organic polymers (e.g., polyphenylene vinylene, copper phthalocyanine, fullerenes), and light absorbing dyes (e.g., ruthenium-centered metalorganic dyes). Photovoltaic devices based on such materials have demonstrated greater photon conversion efficiencies than those exhibited by silicon-based devices. Furthermore, some non-silicon photovoltaic devices are capable of capturing a broader range of electromagnetic radiation than silicon-based devices, and as such, may be more efficient in producing electrical power from solar energy than are silicon-based devices.

Non-silicon photovoltaic devices may comprise thin films of photoactive materials, which may comprise polycrystalline materials or nanoparticles. The thin films of photoactive materials may be formed on flexible substrates such as polyethylene terephthalate (such as that sold under the trade name MYLAR®), which allows for a broad range of new configurations, designs, and applications for photovoltaic devices that were previously unavailable to silicon-based devices. Furthermore, thin film designs may use less than one percent (1%) of the raw materials used in conventional silicon-based devices, and therefore, may cost much less than silicon-based devices in terms of basic raw materials.

Manufacturing processes for thin films of photoactive materials include electroplating techniques, vapor deposition, flash evaporation, and evaporation from binary compounds, spray pyrolysis, and radiofrequency or ion beam sputtering of polycrystalline materials. Unfortunately, a majority of the costs associated in producing thin film photovoltaic devices are incurred in the thin film manufacturing techniques. In addition to being costly, existing thin film manufacturing processes tend to introduce a high number of defects into the films, which can result in an entire batch of material to be rendered inoperable. The next generation of photovoltaic devices would significantly impact the solar energy market if more efficient thin film manufacturing techniques and improved materials could be developed to overcome limitations of conventional processes and materials.

BRIEF SUMMARY OF THE INVENTION

In some embodiments, the present invention includes methods of forming particles in which a single source precursor is subjected or exposed to carbon dioxide. The single source precursor decomposes in the carbon dioxide, and a plurality of particles is formed from one or more products of the decomposition of the single source precursor. In some embodiments, the carbon dioxide may be in a supercritical state. Furthermore, in some embodiments, the particles formed may comprise nanoparticles. In yet further embodiments, the particles formed may comprise a chalcopyrite material.

In further embodiments, the present invention includes methods of forming particles in which a single source precursor is subjected or exposed to a supercritical fluid. The single source precursor decomposes in the supercritical fluid, and a plurality of particles is formed from one or more products of the decomposition of the single source precursor.

In additional embodiments, the present invention includes methods of fabricating a semiconductor device in which a single source precursor is subjected or exposed to carbon dioxide to form a plurality of particles, each comprising a semiconductor material. Electrical contact may then be established between at least some particles of the plurality of particles and an electrode.

In additional embodiments, the present invention includes devices such as, for example, semiconductor devices that include particles formed using embodiments of methods of the present invention, or that are otherwise fabricated using embodiments of methods of the present invention, as described herein.

BRIEF DESCRIPTION OF THE SEVERAL VIEWS OF THE DRAWINGS

While the specification concludes with claims particularly pointing out and distinctly claiming that which is regarded as the present invention, advantages of this invention may be more readily ascertained from the following description of the invention when read in conjunction with the accompanying drawings in which:

DETAILED DESCRIPTION OF THE INVENTION

The illustrations presented herein are not meant to be actual views of any particular apparatus or system, but are merely idealized representations that are employed to describe various embodiments of the present invention. It is noted that elements that are common between figures may retain the same numerical designation.

As used herein, the term "single source precursor" means and includes any molecule or complex that comprises all of the necessary atomic elements, in the appropriate stoichiometric ratios, necessary to form a ternary chalcopyrite material. Single source precursors may comprise so-called organometallic substances. As non-limiting examples, single source precursors include molecules or complexes having the empirical formula $[\{L\}_n M'(ER)_x(X)_y(R)_z M'']$, wherein x is 1-4, x+y+z=4, L is a Lewis base that is coordinated to M' by a dative bond, n is greater than or equal to 1, M' is a Group I-B atom, M'' is a Group III-A atom, E is a Group VI-A atom, X is a group VII-A atom, and each R is individually selected from the group consisting of alkyl, aryl, vinyl, perfluoro alkyl, perfluoro aryl, silane, and carbamato groups. As one particular non-limiting example, $((i\text{-}C_4H_9)_3P)_2Cu(C_2H_5S)_2In(C_2H_5S)_2$ is a single source precursor.

As used herein the term "ternary chalcopyrite material" means and includes any material having a composition generally represented by the formula I-III-VI$_2$, where roman numeral I refers to elements in Group I-B (11) of the periodic table, roman numeral III refers to elements in Group III-A (13) of the periodic table, and roman numeral VI refers to elements in Group VI-A (16) of the periodic table. By ternary, it is meant that the chalcopyrite materials contain atoms from three elemental Groups of the periodic table. For example, approximately twenty-five percent (25%) of the atoms in a ternary chalcopyrite material are from Group I-B (11), approximately twenty-five percent (25%) of the atoms are from Group III-A (13), and approximately fifty percent (50%) of the atoms are from Group VI-A (16). $CuInS_2$, $CuInSe_2$, $Cu(In,Ga)Se_2$, $CuGaSe_2$, and $AgInS_2$ are examples of ternary chalcopyrite materials. It should be noted that ternary chalcopyrites include materials having multiple and/or different atoms from each of three Groups of the periodic table. For example, CuInSSe is a ternary chalcopyrite because it has Cu (Group I-B (11)), In (Group III-A (13)), and S and Se (both from Group VI-A (16)). In addition, molecules of the form (Cu:Ag)(In:Ga)(S:Se), having various ratios of the respectively grouped atoms are all ternary chalcopyrites (Cu and Ag both are in Group I-B (11), In and Ga both are in Group III-A (13), S and Se both are in Group VI-A (16)).

In accordance with some embodiments of the present invention, a single source precursor (SSP) may be subjected to $CO_2$, which may be in the supercritical state, to form particles comprising a ternary chalcopyrite material. In some embodiments, the particles may be nanoparticles (i.e., particles having an average diameter of less than about one hundred nanometers (100 nm)).

Figure 1:
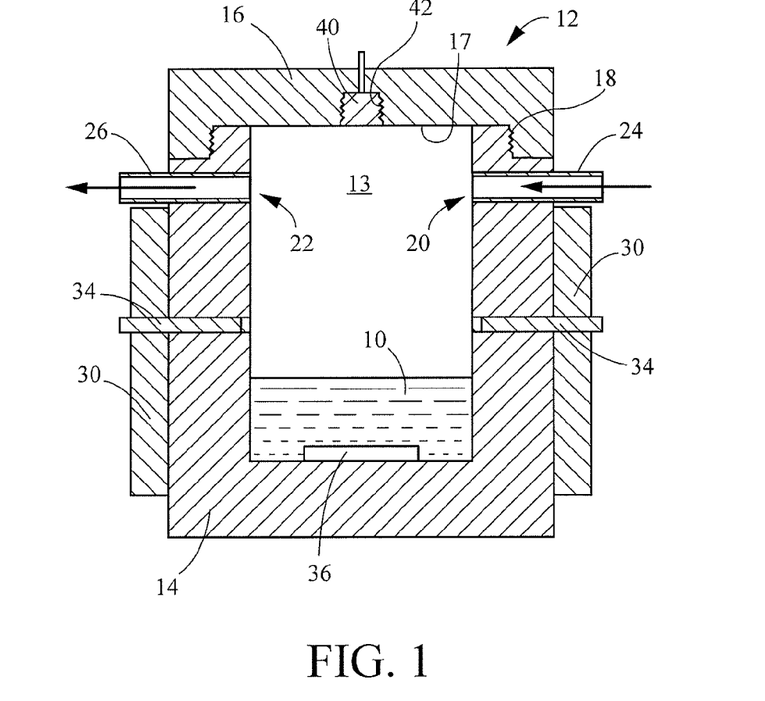
FIG. 1 is a simplified partial cross-sectional view of a portion of an embodiment of a system of the present invention that may be used to subject single source precursors to carbon dioxide to form particles of material in accordance with embodiments of methods of the present invention.

Referring to FIG. 1, a single source precursor (SSP) 10 may be provided in a pressure vessel 12 or another form of a container. The pressure vessel 12 may comprise any enclosure or container having an interior region or cavity 13 for holding pressurized fluids (e.g., liquids, gases, and supercritical fluids). As a non-limiting example, the pressure vessel 12 may comprise a main body 14 and a cap 16, which may be secured together by complementary threads 18, as shown in FIG. 1. Although not shown, grease and/or one or more seals (e.g., O-rings) may be used to provide a fluid-tight seal between the main body 14 and the cap 16.

The pressure vessel 12 may include an inlet 20 for conveying pressurized fluids into the cavity 13, and an outlet 22 for conveying fluids out from the cavity 13. A first conduit 24 may extend through the body 14 of the pressure vessel 12 to the inlet 20 of the cavity 13, and a second conduit 26 may extend from the outlet 22 of the cavity 13 through the body 14 of the pressure vessel 12. A carbon dioxide ($CO_2$) source (not shown) may be used to supply pressurized carbon dioxide to the cavity 13 through the first conduit 24 and the inlet 20. If the carbon dioxide source does not provide pressurized carbon dioxide, a separate pump (not shown) optionally may be used to pressurize the carbon dioxide. The second conduit 26 may lead to a check valve (not shown), which may be used to maintain a desired pressure within the cavity 13. In this configuration, carbon dioxide may be supplied to the cavity 13 and, optionally, may be caused to flow through the cavity 13 from the inlet 20 to the outlet 22.

One or more heating elements 30 (e.g., resistive heating elements) may be used to heat the pressure vessel 12 and the contents thereof. Furthermore, one or more temperature sensors 34 may be used to measure a temperature within the cavity 13. A temperature controller (not shown) (e.g., a computer device or a programmable logic controller) may be used to control a temperature of the contents within the pressure vessel 12 by measuring the temperature of the contents using the one or more temperature sensors 34, and, in response to the measured temperature, selectively applying heat to the contents using the one or more heating elements 30. Although not shown, a cooling system also may be employed to provide further control over the temperature of the contents within the pressure vessel 12.

Optionally, one or more ultrasonic transducers 40 may be positioned and configured to impart ultrasonic vibrations to contents within the cavity 13 of the pressure vessel 12. As a non-limiting example, a recess 42 may be formed in (e.g., machined into) the inner surface 17 of the cap 16, and an ultrasonic transducer 40 may be positioned within (e.g., threaded into) the recess 42. In other embodiments, one or more ultrasonic transducers 40 may be positioned within recesses in the sidewalls and/or the bottom wall of the main body 14 of the pressure vessel 12.

With continued reference to FIG. 1, after providing the SSP 10 within the pressure vessel 12, carbon dioxide may be introduced into cavity 13 of the pressure vessel 12 through the first conduit 24 and the inlet 20. Upon mixing of the carbon dioxide with the SSP 10, the SSP 10 may decompose to form particles of ternary chalcopyrite material. Other products of the decomposition of the SSP 10 may be dissolved in and carried away by the carbon dioxide through the outlet 22 and the second conduit 26. Such products of the decomposition of the SSP 10 may be referred to as "leaving groups."

By way of example and not limitation, SSP 10 may be provided within the pressure vessel 12, and the SSP 10 may be heated to a temperature greater than about eighteen degrees Celsius (18° C.). In some embodiments, the temperature of the SSP 10 may be heated to a temperature greater than about thirty-one point one degrees Celsius (31.1° C.), which is the critical temperature of carbon dioxide. The SSP 10 may be susceptible to thermal decomposition at temperatures above a certain threshold thermal decomposition temperature, which is dependent on the particular composition of the SSP 10. Therefore, it may be desirable to maintain the temperature of the SSP 10 below the thermal decomposition temperature of the particular SSP 10 being used. As a non-limiting example, it may be desirable to maintain the temperature of the SSP 10 below about one hundred fifty degrees Celsius (150° C.).

After bringing the temperature of the SSP 10 to temperature, carbon dioxide may be caused to flow into and through the cavity 13 from the inlet 20 to the outlet 22. The carbon dioxide may, in some embodiments, be in the supercritical state. For example, the carbon dioxide may be at a temperature at or above about thirty-one point one degrees Celsius (31.1° C.) and at a pressure at or above about 7.38 megapascals (MPa). In other embodiments, however, the carbon dioxide may be in the liquid state, and not in the supercritical state. For example, in some embodiments, the temperature of the carbon dioxide may be as low as about eighteen degrees Celsius (18° C.), and the pressure of the carbon dioxide may be as low as about five point five megapascals (5.5 MPa). While it may be desirable to maintain the temperature of the carbon dioxide below the threshold thermal decomposition temperature of the SSP 10, the pressure of the carbon dioxide may be as high as fifty megapascals (50 MPa) or more.

As the carbon dioxide is caused to flow into and through cavity 13, a mixing mechanism or device 36 may, optionally, be used to enhance mixing of the carbon dioxide with the SSP 10. For example, the mixing mechanism or device 36 may comprise a magnetic stir rod, which may be rotated within the SSP 10 as the carbon dioxide flows through the cavity 13. In other embodiments, however, a mixing mechanism or device 36 may not be used. After flowing the carbon dioxide through the cavity 13 for a period of time, the SSP 10 may decompose to form particles of ternary chalcopyrite material. The exact length of time required to form the particles of ternary chalcopyrite material may depend upon one or more of the composition of the SSP 10, the temperature and pressure of the SSP 10 and the carbon dioxide, the rate of flow of carbon dioxide through the cavity 13, and the extent of mixing provided between the SSP 10 and the carbon dioxide.

As the SSP 10 is subjected to the carbon dioxide within the cavity 13, ultrasonic vibrations may be imparted to the mixture using the one or more ultrasonic transducers 40. By imparting ultrasonic vibrations to the mixture, the temperature required to cause decomposition of the SSP may be reduced and/or the decomposition reaction may be driven further to completion.

As one non-limiting example, the cavity 13 may be generally cylindrical and may have a volume of about three point five milliliters (3.5 ml). The cavity 13 may be heated to greater than about one hundred degrees Celsius (100° C.) to drive any water out from the cavity 13. Some SSPs, such as $((i\text{-}C_4H_9)_3P)_2Cu(C_2H_5S)_2In(C_2H_5S)_2$, are sensitive to moisture and should be kept over a desiccant prior to use. The temperature of the cavity 13 then may be reduced to about seventy-five degrees Celsius (75° C.), and about four hundred microliters (400 μl) of $((i\text{-}C_4H_9)_3P)_2Cu(C_2H_5S)_2In(C_2H_5S)_2$ may be provided within the cavity 13. Carbon dioxide then may be pumped into the cavity 13 and pressurized to about twenty point seven megapascals (20.7 MPa). A magnetic stir bar then may be rotated within the cavity 13 for about five minutes (5.0 min.). Carbon dioxide then may be caused to flow through the cavity 13 at a flow rate of between about one milliliters per minute (1.0 mL/min.) and about two milliliters per minute (2.0 mL/min.) for about ten minutes (10.0 min.) while maintaining the temperature in the cavity 13 between about sixty-six degrees Celsius (66° C.) and about one hundred fifty degrees Celsius (150° C.) and the pressure in the cavity 13 above about twenty megapascals (20.0 MPa). More particularly, the temperature in the cavity 13 may be maintained at about seventy-five degrees Celsius (75° C.) and the pressure in the cavity 13 may be maintained at about twenty point seven megapascals (20.7 MPa). Upon completion of this process, at least substantially all of the $((i\text{-}C_4H_9)_3P)_2Cu(C_2H_5S)_2In(C_2H_5S)_2$ may have decomposed to form nanoparticles of $CuInS_2$, which may have an average particle size of about three nanometers (3 nm) or less. This particular method is set forth as a non-limiting example, and other methods of forming particles from SSPs by subjecting the SSPs to carbon dioxide are within the scope of the present invention.

Optionally, certain additives may be mixed with the SSP 10 prior to introducing the carbon dioxide into the cavity 13 to facilitate the decomposition of the SSP 10. By way of example and not limitation, alkane thiols or alkane polythiols may be mixed with the SSP 10 to facilitate the decomposition of the SSP 10 upon subjecting the SSP 10 to the carbon dioxide, as previously discussed. Such additives are believed to form a complex with the SSP 10 that effectively reduces the activation energy for the decomposition process. As a non-limiting example, a volume of alkane dithiol equal to between about one half percent (0.5%) and about five percent (5.0%) of the volume of the SSP 10 may be mixed with the SSP 10 prior to introducing the carbon dioxide into the cavity 13. If such additives are mixed with the SSP 10, it may not be necessary to flow carbon dioxide through the cavity 13 from the inlet 20 to the outlet 22 to achieve decomposition of the SSP 10 into particles of ternary chalcopyrite material. In such embodiments, carbon dioxide may simply be introduced into the cavity 13 at elevated temperatures and pressures to cause the decomposition of the SSP 10, with or without mixing.

The methods described above may result in the formation of particles comprising a ternary chalcopyrite material. As known in the art, at least some ternary chalcopyrite materials are semiconductor materials. Furthermore, in some embodiments, the particles formed from embodiments of the methods of the invention, as described herein, may comprise nanoparticles. In some embodiments, the resulting nanoparticles may have an average particle size (e.g., an average diameter) of about fifteen nanometers (15 nm) or less. In some embodiments, the nanoparticles may even have an average particle size of about three nanometers (3 nm) or less.

Additionally, the inventors have found that the average particle size of the particles formed by embodiments of methods of the present invention, as described above, is at least partially a function of the operating parameters of the method. In other words, by selectively varying one or more of the temperature of the SSP 10 and the carbon dioxide, the pressure of the SSP 10 and the carbon dioxide, the rate of flow of carbon dioxide, and the extent of mixing between the SSP 10 and the carbon dioxide, the average particle size of the resulting particles may be selectively varied. For example, relatively higher temperatures and pressures of the SSP 10 and the carbon dioxide (and thus, relatively higher densities) within the cavity 13 may result in a relatively smaller average particle size than will relatively lower temperatures and pressures (and densities).

In accordance with additional embodiments of the present invention, an SSP 10 may be subjected to a supercritical fluid (e.g., a supercritical fluid other than carbon dioxide) as previously described herein with reference to FIG. 1 to form particles of material (e.g., nanoparticles of ternary chalcopyrite material). Such supercritical fluids may comprise, for example, supercritical methane, supercritical ethane, supercritical propane, supercritical ammonia, supercritical nitrous oxide, supercritical sulfur hexafluoride, supercritical materials comprising alkanes with linked halogens, such as those commercially sold using the trade name HALON (e.g., pentafluoroethane, chlorotrifluoromethane, 1,1,1,2-tetrafluoroethane, chlorodifluoromethane, tetrafluoromethane, trifluoromethane, difluoromethane, perfluoropropane, perfluoroisobutane, perfluorocyclobutane, heptafluoropropane, etc.), and mixtures of any of the foregoing materials.

In additional embodiments, particles (e.g., nanoparticles of ternary chalcopyrite materials) may be formed on another substrate structure or material within the pressure vessel 12. By way of example and not limitation, a substrate (not shown) that includes a layer of material on or over which it is desired to deposit particles of ternary chalcopyrite material may be provided within the cavity 13 of the pressure vessel 12. In some embodiments, the substrate may simply be immersed within the SSP 10 in the cavity 13. In other embodiments, at least a portion of the substrate may be encapsulated in a protective material (e.g., an inert polymer material) such that only a portion of the substrate is exposed (that portion of the substrate on or over which it is desired to deposit particles of ternary chalcopyrite material). After providing the substrate and the SSP 10 within the cavity 13, the SSP 10 may be subjected to carbon dioxide as previously described with reference to FIG. 1. Such methods may be used, for example, to form and deposit nanoparticles of ternary chalcopyrite within the pores of a porous layer of substrate material, such as, for example, a layer of mesoporous semiconductive oxide material (e.g., mesoporous titania ($TiO_2$)). As referred to herein, "mesoporous" materials include materials having pores that exhibit an average pore size of between about five nanometers (5 nm) and about fifty nanometers (50 nm). Such a process may provide enhanced penetration of the nanoparticles into the pores of the porous substrate and, hence, may provide increased contact area between the substrate and the layer of material formed using the nanoparticles.

In yet further embodiments, substrate particles (not shown) may be mixed with the SSP 10 to form a slurry, which may be provided within the cavity 13 and subjected to carbon dioxide, as previously described herein. The carbon dioxide may cause the SSP 10 to decompose and form particles (e.g., nanoparticles of ternary chalcopyrite material), which may be deposited on the substrate particles. The substrate particles, with the nanoparticles of ternary chalcopyrite material then may be used in subsequent processes to form semiconductor devices. The substrate particles may be relatively larger than the nanoparticles of ternary chalcopyrite material formed from the SSP 10. For example, the substrate particles may have an average particle size that is between about ten (10) times and about ten thousand (10,000) times greater than the average particle size of the nanoparticles of ternary chalcopyrite material formed from the SSP 10. Optionally, the substrate particles may comprise a porous material. As one non-limiting example, the substrate particles may comprise particles of mesoporous titania ($TiO_2$) having an average particle size between about one micron (1 μm) and about ten microns (10 μm), and nanoparticles of $CuInS_2$ may be formed and deposited on the substrate particles and within the pores of the substrate particles by mixing the substrate particles with the SSP 10 comprising $((i\text{-}C_4H_9)_3P)_2Cu(C_2H_5S)_2In(C_2H_5S)_2$ and subjecting the SSP 10 to carbon dioxide (e.g., supercritical carbon dioxide) within an enclosure to cause the SSP 10 to decompose and form the nanoparticles of $CuInS_2$.

Although embodiments of methods of the present invention have been described above in reference to ternary chalcopyrite materials and corresponding single source precursors (SSPs) for forming the same, the present invention is not limited to methods of forming ternary chalcopyrite materials from corresponding single source precursors. In further embodiments, single source precursors may be subjected to carbon dioxide (e.g., supercritical carbon dioxide or liquid carbon dioxide) to form other types of particles including, for example, silicon nanoparticles, metallic nanoparticles (e.g., silver, gold, vanadium, or platinum nanoparticles) or nanoparticles of semiconductor materials other than ternary chalcopyrites (e.g., gallium arsenide, indium phosphide, gallium phosphide, silicon carbide, zinc oxide, etc.).

By way of example and not limitation, the following are examples of copper-indium SSPs: [bis(ethanethiolato)indium]bis[μ-(ethanethiolato)]bis (triisobutylphosphine)-copper; [bis(ethanethiolato)indium]bis[μ-(ethanethiolato)]bis (trihexylphosphine)-copper; [bis(ethanethiolato)indium]bis [μ-(ethanethiolato)]bis (triphenylphosphine)-copper; [bis (ethanethiolato)indium]bis[μ-(ethanethiolato)]bis (perfluorotriphenylphosphine)-copper; [bis(propanethiolato)indium] bis[μ-(propanethiolato)]bis (triisobutylphosphine)-copper; [bis(propanethiolato)indium]bis[μ-(propanethiolato)]bis (trihexylphosphine)-copper; [bis(propanethiolato)indium] bis[μ-(propanethiolato)]bis (triphenylphosphine)-copper; [bis(propanethiolato)indium]bis[μ-(propanethiolato)]bis (perfluorotriphenylphosphine)-copper; [bis(hexanethiolato) indium]bis[μ-(propanethiolato)]bis (triisobutylphosphine)-copper; [bis(hexanethiolato)indium]bis[μ-(propanethiolato)] bis (trihexylphosphine)-copper; [bis(hexanethiolato)indium] bis[μ-(propanethiolato)]bis (triphenylphosphine)-copper; [bis(hexanethiolato)indium]bis[μ-(propanethiolato)]bis (perfluorotriphenylphosphine)-copper; [bis(4-trifluoromethyl-thiophenolato)indium]bis[μ-(4-trifluoromethyl-thiophenolato)]bis(triisobutylphosphine)-copper; [bis(4-trifluoromethyl-thiophenolato)indium]bis[μ-(4- trifluoromethyl-thiophenolato)]bis(trihexylphosphine)-copper; [bis(4-trifluoromethyl-thiophenolato)indium]bis [μ-(4-trifluoromethyl-thiophenolato)]bis(triphenylphosphine)-copper; [bis(4-trifluoromethyl-thiophenolato)indium]bis[μ-(4-trifluoromethyl-thiophenolato)]bis(perfluorotriphenylphosphine)-copper; [bis(3,5-bis(trifluoromethyl)-thiophenolato)indium]bis[μ-(3,5-bis(trifluoromethyl)-thiophenolato)]bis(triisobutylphosphine)-copper; and [bis(3,5-bis(trifluoromethyl)-thiophenolato)indium]bis[μ-(3,5-bis(trifluoromethyl) thiophenolato)]bis(trihexylphosphine)-copper.

By way of example and not limitation, the following are examples of copper-gallium SSPs: [bis(ethanethiolato)Gallium]bis[μ-(ethanethiolato)]bis (triisobutylphosphine)-copper; [bis(ethanethiolato)Gallium]bis[μ-(ethanethiolato)]bis (trihexylphosphine)-copper; [bis(ethanethiolato)Gallium]bis[μ-(ethanethiolato)]bis (triphenylphosphine)-copper; [bis(ethanethiolato)Gallium]bis[μ-(ethanethiolato)]bis (perfluorotriphenylphosphine)-copper; [bis(propanethiolato)Gallium]bis[μ-(propanethiolato)]bis (triisobutylphosphine)-copper; [bis(propanethiolato)Gallium]bis[μ-(propanethiolato)]bis (trihexylphosphine)-copper; [bis(propanethiolato)Gallium]bis[μ-(propanethiolato)]bis (triphenylphosphine)-copper; [bis(propanethiolato)Gallium]bis[μ-(propanethiolato)]bis (perfluorotriphenylphosphine)-copper; [bis(hexanethiolato)Gallium]bis[μ-(propanethiolato)]bis (triisobutylphosphine)-copper; [bis(hexanethiolato)Gallium]bis[μ-(propanethiolato)]bis (trihexylphosphine)-copper; [bis(hexanethiolato)Gallium]bis[μ-(propanethiolato)]bis (triphenylphosphine)-copper; [bis(hexanethiolato)Gallium]bis[μ-(propanethiolato)]bis (perfluorotriphenylphosphine)-copper; [bis(4-trifluoromethyl-thiophenolato)Gallium]bis[μ-(4-trifluoromethyl-thiophenolato)]bis(triisobutylphosphine)-copper; [bis(4-trifluoromethyl-thiophenolato)Gallium]bis[μ-(4-trifluoromethyl-thiophenolato)]bis(trihexylphosphine)-copper; [bis(4-trifluoromethyl-thiophenolato)Gallium]bis[μ-(4-trifluoromethyl-thiophenolato)]bis(triphenylphosphine)-copper; [bis(4-trifluoromethyl-thiophenolato)Gallium]bis[μ-(4-trifluoromethyl-thiophenolato)]bis(perfluorotriphenylphosphine)-copper; [bis(3,5-bis(trifluoromethyl)-thiophenolato)Gallium]bis[μ-(3,5-bis(trifluoromethyl)-thiophenolato)]bis(triisobutylphosphine)-copper; [bis(3,5-bis(trifluoromethyl)-thiophenolato)Gallium]bis[μ-(3,5-bis(trifluoromethyl)-thiophenolato)]bis(trihexylphosphine)-copper; [bis(3,5-bis(trifluoromethyl)-thiophenolato)Gallium]bis[μ-(3,5-bis(trifluoromethyl)-thiophenolato)]bis(triphenylphosphine)-copper; and [bis(3,5-bis(trifluoromethyl)-thiophenolato) Gallium]bis[μ-(3,5-bis(trifluoromethyl)-thiophenolato)]bis(perfluorotriphenylphosphine)-copper.

By way of example and not limitation, the following are examples of silver-indium SSPs: [bis(ethanethiolato)indium]bis[μ-(ethanethiolato)]bis (triisobutylphosphine)-silver; [bis(ethanethiolato)indium]bis[μ-(ethanethiolato)]bis (trihexylphosphine)-silver; [bis(ethanethiolato)indium]bis[μ-(ethanethiolato)]bis (triphenylphosphine)-silver; [bis(ethanethiolato)indium]bis[μ-(ethanethiolato)]bis (perfluorotriphenylphosphine)-silver; [bis(propanethiolato)indium]bis[μ-(propanethiolato)]bis (triisobutylphosphine)-silver; [bis(propanethiolato)indium]bis[μ-(propanethiolato)]bis (trihexylphosphine)-silver; [bis(propanethiolato)indium]bis[μ-(propanethiolato)]bis (triphenylphosphine)-silver; [bis(propanethiolato)indium]bis[μ-(propanethiolato)]bis (perfluorotriphenylphosphine)-silver; [bis(hexanethiolato)indium]bis[μ-(propanethiolato)]bis (triisobutylphosphine)-silver; [bis(hexanethiolato)indium]bis[μ-(propanethiolato)]bis (trihexylphosphine)-silver; [bis(hexanethiolato)indium]bis[μ-(propanethiolato)]bis (triphenylphosphine)-silver; [bis(hexanethiolato)indium]bis[μ-(propanethiolato)]bis (perfluorotriphenylphosphine)-silver; [bis(4-trifluoromethyl-thiophenolato)indium]bis[μ-(4-trifluoromethyl-thiophenolato)]bis(triisobutylphosphine)-silver; [bis(4-trifluoromethyl-thiophenolato)indium]bis[μ-(4-trifluoromethyl-thiophenolato)]bis(trihexylphosphine)-silver; [bis(4-trifluoromethyl-thiophenolato)indium]bis[1-(4-trifluoromethyl-thiophenolato)]bis (triphenylphosphine)-silver; [bis(4-trifluoromethyl-thiophenolato)indium]bis[μ-(4-trifluoromethyl-thiophenolato)]bis(perfluorotriphenylphosphine)-silver; [bis(3,5-bis(trifluoromethyl)-thiophenolato)indium]bis[μ-(3,5-bis(trifluoromethyl)-thiophenolato)]bis(triisobutylphosphine)-silver; [bis(3,5-bis(trifluoromethyl)-thiophenolato) indium]bis[μ-(3,5-bis(trifluoromethyl)-thiophenolato)]bis(trihexylphosphine)-silver; [bis(3,5-bis(trifluoromethyl)-thiophenolato)indium]bis[μ-(3,5-bis(trifluoromethyl)-thiophenolato) ]bis(triphenylphosphine)-silver; and [bis(3,5-bis(trifluoromethyl)-thiophenolato)indium]bis [μ-(3,5-bis(trifluoromethyl)-thiophenolato)]bis(perfluorotriphenylphosphine)-silver.

By way of example and not limitation, the following are examples of silver-gallium SSPs: [bis(ethanethiolato)gallium]bis[μ-(ethanethiolato)]bis (triisobutylphosphine)-silver; [bis(ethanethiolato)gallium]bis[μ-(ethanethiolato)]bis (trihexylphosphine)-silver; [bis(ethanethiolato)gallium]bis[μ-(ethanethiolato)]bis (triphenylphosphine)-silver; [bis(ethanethiolato)gallium]bis[μ-(ethanethiolato)]bis (perfluorotriphenylphosphine)-silver; [bis(propanethiolato)gallium]bis[μ-(propanethiolato)]bis (triisobutylphosphine)-silver; [bis(propanethiolato)gallium]bis[μ-(propanethiolato)]bis (trihexylphosphine)-silver; [bis(propanethiolato)gallium]bis[μ-(propanethiolato)]bis (triphenylphosphine)-silver; [bis(propanethiolato)gallium]bis[μ-(propanethiolato)]bis (perfluorotriphenylphosphine)-silver; [bis(hexanethiolato)gallium]bis[μ-(propanethiolato)]bis (triisobutylphosphine)-silver; [bis(hexanethiolato)gallium]bis[μ-(propanethiolato)]bis (trihexylphosphine)-silver; [bis(hexanethiolato)gallium]bis[μ-(propanethiolato)]bis (triphenylphosphine)-silver; [bis(hexanethiolato)gallium]bis[μ-(propanethiolato)]bis (perfluorotriphenylphosphine)-silver; [bis(4-trifluoromethyl-thiophenolato)gallium]bis[μ-(4-trifluoromethyl-thiophenolato)]bis(triisobutylphosphine)-silver; [bis(4-trifluoromethyl-thiophenolato)gallium]bis[μ-(4-trifluoromethyl-thiophenolato)]bis(trihexylphosphine)-silver; [bis(4-trifluoromethyl-thiophenolato)gallium]bis[μ-(4-trifluoromethyl-thiophenolato)]bis (triphenylphosphine)-silver; [bis(4-trifluoromethyl-thiophenolato)gallium]bis[μ-(4-trifluoromethyl-thiophenolato)]bis(perfluorotriphenylphosphine)-silver; [bis(3,5-bis(trifluoromethyl)-thiophenolato)gallium]bis[μ-(3,5-bis(trifluoromethyl)-thiophenolato)]bis (triisobutylphosphine)-silver; [bis(3,5-bis(trifluoromethyl)-thiophenolato)gallium]bis[μ-(3,5-bis (trifluoromethyl)-thiophenolato)]bis (trihexylphosphine)-silver; [bis(3,5-bis(trifluoromethyl)-thiophenolato)gallium]bis[μ-(3,5-bis(trifluoromethyl)-thiophenolato)]bis(triphenylphosphine)-silver; and [bis(3,5-bis(trifluoromethyl)-thiophenolato) gallium]bis[μ-(3,5-bis(trifluoromethyl)-thiophenolato)]bis(perfluorotriphenylphosphine)-silver.

The examples of SSPs set forth above are examples only, and those of ordinary skill in the art will understand that such examples may be used to derive many other SSPs for use in forming other types of particles and nanoparticles using the methods described herein.

Furthermore, two or more SSPs may be mixed together before decomposing the SSPs, as described herein, to form particles therefrom. Such mixtures of SSPs may be used to form particles (e.g., nanoparticles) having compositions that include two or more elements. The ratios of the individual SSPs in such mixtures may be selectively adjusted to tailor the composition of the resulting particles of material.

In some embodiments of the present invention, the SSP (or SSPs) used may not dissolve in the carbon dioxide or supercritical fluid used to cause decomposition thereof. In other embodiments, however, the SSP (or SSPs) may at least partially dissolve in the carbon dioxide or supercritical fluid. For example, at least some SSPs that include fluorine may be at least partially soluble in supercritical carbon dioxide.

It is understood that additives (e.g., co-solvents) may be combined with the carbon dioxide or supercritical fluid to enhance one or more characteristics of the SSP decomposition process. For example, when using carbon dioxide or supercritical carbon dioxide, one or more co-solvents such as, for example, water, alcohol, hexane, acetone, acetonitrile, methylene chloride, and ethyl acetate may be added to the carbon dioxide or supercritical carbon dioxide at concentrations of, for example, above five (5) mol % or less.

As described above with reference to FIG. 1, SSPs may be subjected to carbon dioxide or supercritical fluid in an enclosure to cause the SSPs to decompose and form a plurality of particles of material. In embodiments in which the SSP (or mixture of SSPs) will dissolve in the carbon dioxide or supercritical fluid, the process may not be conducted in an enclosure as described with reference to FIG. 1.

For example, in some embodiments of the present invention, one or more SSPs may be dissolved in carbon dioxide or supercritical fluid, and the resulting mixture may be sprayed out from an orifice (e.g., a nozzle) and deposited onto a heated surface to cause the one or more SSPs to decompose and form a plurality of particles of material. The heated surface may comprise a target substrate on which it is desired to form or deposit the particles of material.

In additional embodiments of the present invention, one or more SSPs may be dissolved in carbon dioxide or supercritical fluid, the resulting mixture may be provided in a container, and one or more catalysts (e.g., alkane thiols or alkane polythiols) may be added to the mixture to cause the one or more SSPs to decompose and form a plurality of particles of material.

In yet further embodiments, one or more SSPs may be dissolved in carbon dioxide or supercritical fluid to form a first mixture, and a first fluid stream may be formed from the resulting first mixture. One or more catalysts (e.g., alkane thiols or alkane polythiols) may be may be dissolved in carbon dioxide or supercritical fluid to form a second mixture, and a second fluid stream may be formed from the resulting second mixture. The first and second fluid streams could then be mixed together to cause the one or more SSPs to decompose and to precipitate a plurality of particles of material out from the mixture of the first and second fluid streams. Optionally, the first and second fluid streams could be mixed together as they are sprayed out from an orifice (e.g., a nozzle) and deposited onto a heated surface to cause the one or more SSPs to decompose and form a plurality of particles of material on the heated surface, as mentioned above.

Embodiments of methods of the present invention, as described herein, may provide one or more advantages over previously known methods for forming particles (e.g., nanoparticles comprising ternary chalcopyrite materials). By way of example and not limitation, embodiments of methods of the present invention may facilitate the formation of nanoparticles having relatively smaller average particle sizes relative to previously known methods for forming nanoparticles. Embodiments of methods of the present invention may also provide relatively greater control over the size of the nanoparticles produced therefrom relative to previously known methods for forming nanoparticles. Furthermore, embodiments of methods of the present invention also may produce nanoparticles that exhibit a particle size distribution that is relatively tighter or narrower than a particle size distribution of nanoparticles produced using methods for fabricating nanoparticles of ternary chalcopyrite materials presently known in the art. In other words, a plurality of nanoparticles produced by embodiments of methods of the present invention may exhibit a particle size distribution having a relatively lower standard deviation relative to the particle size distribution of a plurality of nanoparticles formed using previously known methods. Additionally, embodiments of methods of the present invention may be used to form nanoparticles at relatively lower temperatures (e.g., temperatures below about 100° C.) than previously known methods for forming such nanoparticles.

Particles formed using embodiments of methods of the present invention may be used in many different types of devices. For example, particles formed using embodiments of methods of the present invention may be used in semiconductor devices such as, for example, diodes (e.g., light emitting diodes (LEDs)), photovoltaic devices, sensors, solid-state lasers, and integrated circuits (e.g., memory modules and microprocessors). A few simplified non-limiting examples of semiconductor devices are described below with reference to FIGS. 2-6.

Figure 2:
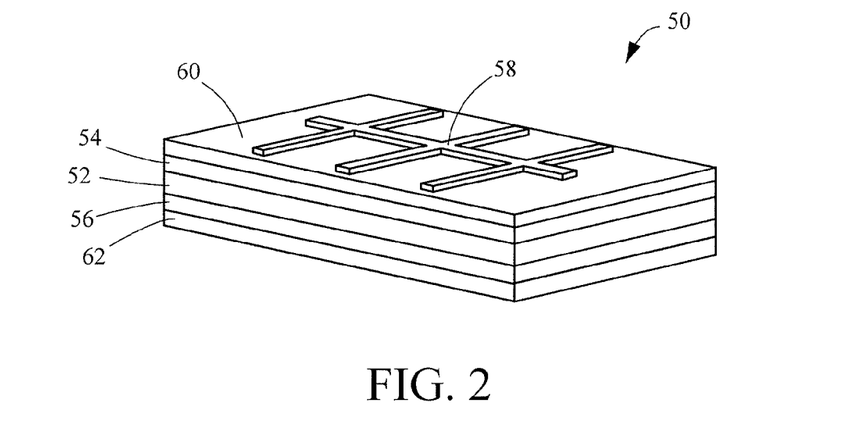
FIG. 2 is a simplified perspective view of an embodiment of a semiconductor device of the present invention that may be formed using particles fabricated using the systems and methods described with reference to FIG. 1.

An embodiment of a single junction semiconductor device 50 of the present invention is shown in FIG. 2. As shown in FIG. 2, the semiconductor device 50 includes a first layer of semiconductor material 52 and a second layer of semiconductor material 54, which may be disposed adjacent to the first layer of semiconductor material 52. The device 50 may further include a first electrode 56 and a second electrode 58. The first electrode 56 may be electrically coupled (either directly or indirectly) to a side of the first layer of semiconductor material 52 opposite the second layer of semiconductor material 54, and the second electrode 58 may be coupled (either directly or indirectly) to a side of the second layer of semiconductor material 54 opposite the first layer of semiconductor material 52. Optionally, an antireflective coating (ARC) 60 may be provided between the second layer of semiconductor material 54 and the second electrode 58, as shown in FIG. 2. Furthermore, the device 50 may comprise at least a portion of a substrate 62, on which one or more of the various layers of the device 50 may be formed.

In some embodiments, the first electrode 56 may comprise an at least substantially continuous sheet or layer of conductive material (e.g., molybdenum, copper, nickel, aluminum, silver, doped semiconductor materials, etc.), and the second electrode 58 may comprise horizontally extending (with respect to a major plane of the device 50) conductive lines or traces, which may be formed by patterning (e.g., masking and etching) an at least substantially continuous sheet or layer of conductive material like that of the first electrode 56.

The optional antireflective coating 60 may comprise any material known in the art for antireflective coatings, such as, for example, silicon nitride ($Si_3N_4$) or silica ($SiO_2$). Furthermore, the substrate 62 may comprise, for example, a full or partial wafer of semiconductor material (e.g., silicon, germanium, gallium arsenide, indium phosphide, and other III-V type semiconductor materials), a full or partial silicon-oninsulator (SOI) type substrate, a full or partial silicon-on-sapphire (SOS) type substrate, etc.

Figure 3:
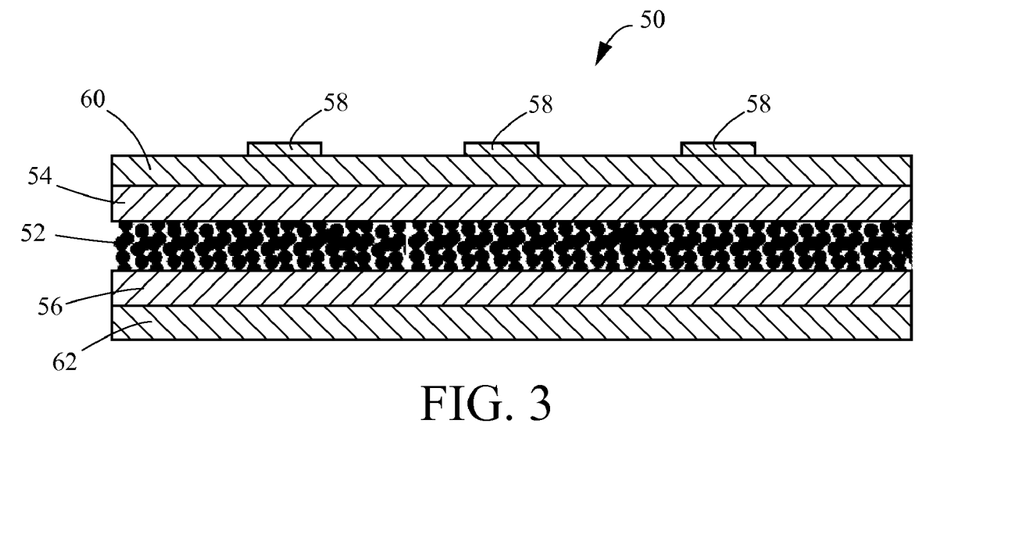
FIG. 3 is a simplified cross-sectional view of the semiconductor device shown in FIG. 2 illustrating different layers thereof.

The first layer of semiconductor material 52 and the second layer of semiconductor material 54 may comprise different materials that exhibit different energy band structures. FIG. 3 is a simplified cross-sectional view of the semiconductor device 50 shown in FIG. 2 illustrating different layers thereof. As illustrated in the simplified drawing of FIG. 3, at least one of the first layer of semiconductor material 52 and the second layer of semiconductor material 54 may be formed using particles (e.g., nanoparticles) fabricated using embodiments of methods of the present invention, as previously described with reference to FIG. 1. As one non-limiting example, the first layer of semiconductor material 52 may be formed using nanoparticles of $CuInS_2$ having an average particle size of less than about fifteen (15) nanometers, and the second layer of semiconductor material 54 may comprise another semiconductor material such as, for example, a semiconductive oxide material (e.g., $ZnO$ or $TiO_2$), which, optionally, may be porous in some embodiments. Although not shown in FIG. 3, a buffer layer may be provided between the first layer of semiconductor 52 and the second layer of semiconductor material 54. By way of example and not limitation, when the nanoparticles of the first layer of semiconductor material 52 comprise $CuInS_2$, a buffer layer may comprise a relatively thin layer of $In_2S_3$.

By way of example and not limitation, the first layer of semiconductor material 52 may have an average thickness that varies from about the thickness of a monolayer of nanoparticles (e.g., less than about three nanometers (3 nm)) up to several microns. In some embodiments, however, the first layer of semiconductor material 52 may have an average thickness greater than about one-half of a micron (½ µm) to ensure that a significant amount of radiation (e.g., solar radiation) impinging on the device 50 is absorbed by the first layer of semiconductor material 52. Similarly, as a non-limiting example, the second layer of semiconductor material 54 may have an average thickness ranging from about twenty nanometers (20 nm) up to several microns.

By way of example and not limitation, the first layer of semiconductor material 52 may be formed by fabricating a plurality of nanoparticles using the methods previously described herein with reference to FIG. 1. The nanoparticles may be mixed with a solvent to form a solution or a slurry, which then may be deposited over the first electrode 56 (or the second layer of semiconductor material 54, depending on which layer is fabricated first), and the solvent may be allowed to evaporate, leaving the nanoparticles behind. Optionally, subsequent processes may be used to promote adhesion of the nanoparticles to one another and to the adjacent layer of material. For example, the nanoparticles may be subjected to an annealing process to promote further bonding of the nanoparticles to one another and to the adjacent layer of material. In further embodiments, a physical pressing process or an adhesive material may be used to promote further bonding of the nanoparticles to one another and to the adjacent layer of material. In additional embodiments, the first layer of material may be fabricated and positioned within the cavity 13 of a pressure vessel 12 (FIG. 1), and the nanoparticles may be formed and deposited in situ within the pressure vessel 12, as previously described with reference to FIG. 1.

Depending on the composition and configuration of the different material layers of the device 50 shown in FIGS. 2 and 3, the device 50 may comprise a diode (e.g., a light emitting diode (LED)), a photovoltaic device, a radiation sensor, or another type of semiconductor device. Furthermore, embodiments of the present invention include solid-state laser devices, such as, for example, vertical cavity surface emitting lasers (VCSELs), that comprise one or more layers of semiconductor material formed using particles (e.g., nanoparticles) fabricated using embodiments of the present invention, as previously described with reference to FIG. 1. In such embodiments, additional layers of material (not shown) may be used to form a resonant cavity (e.g., to form Bragg mirrors) within which the first layer of semiconductor material 52 and the second layer of semiconductor material 52 may be disposed.

Figure 4:
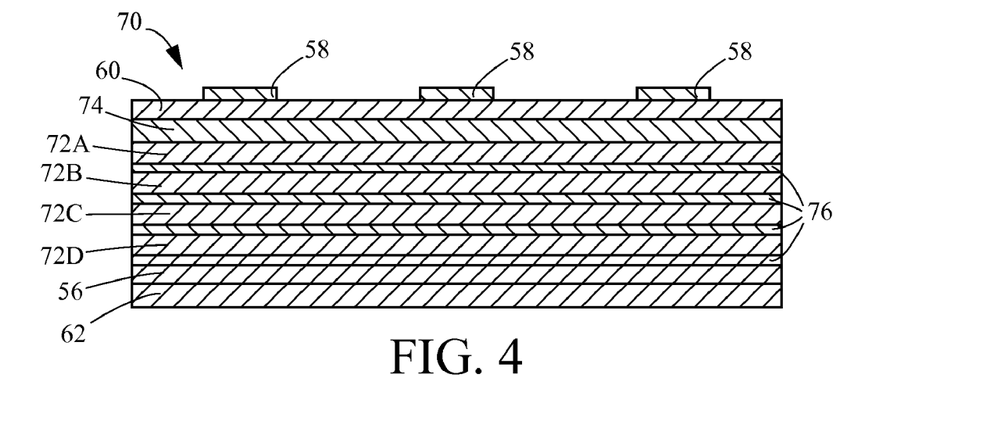
FIG. 4 is a simplified cross-sectional view of another embodiment of a semiconductor device, similar to that of FIG. 3, that may be formed using particles fabricated using the systems and methods described with reference to FIG. 1 and that includes multiple layers of semiconductor material, each layer formed using nanoparticles of semiconductor material.

Embodiments of the present invention are not limited to single junction semiconductor devices. FIG. 4 illustrates an embodiment of a multi-junction semiconductor device 70 of the present invention. The semiconductor device 70, like the semiconductor device 50, optionally may comprise a first electrode 56, a second electrode 58, an antireflective coating (ARC) 60, and a substrate 62, as previously described with reference to the device 50 shown in FIGS. 2 and 3. The device 70, however, may include a plurality of layers of semiconductor material that are each formed using nanoparticles fabricated using embodiments of methods of the present invention, as previously described with reference to FIG. 1. By way of example, the device 70 may include a first layer of semiconductor material 72A, a second layer of semiconductor material 72B, a third layer of semiconductor material 72C, and a fourth layer of semiconductor material 72D, each of which may be formed using nanoparticles fabricated using embodiments of methods of the present invention, as previously described with reference to FIG. 1.

In some embodiments, each of the layers of semiconductor material 72A-72D may be formed using nanoparticles having at least substantially similar chemical compositions. As a non-limiting example, each of the layers of semiconductor material 72A-72D may be formed using nanoparticles comprising $CuInS_2$. In other embodiments, the layers of semiconductor material 72A-72D each may be formed using nanoparticles having differing chemical compositions.

Furthermore, in some embodiments, each of the layers of semiconductor material 72A-72D may be formed using nanoparticles having at least substantially similar average particle sizes. In other embodiments, the layers of semiconductor material 72A-72D each may be formed using nanoparticles having differing average particle sizes. As a non-limiting example, the first layer of semiconductor material 72A may be formed using nanoparticles having an average particle size of about three nanometers (3 nm), the second layer of semiconductor material 72B may be formed using nanoparticles having an average particle size of about five nanometers (5 nm), the third layer of semiconductor material 72C may be formed using nanoparticles having an average particle size of about seven nanometers (7 nm), and the fourth layer of semiconductor material 72D may be formed using nanoparticles having an average particle size of about nine nanometers (9 nm). In this configuration, each of the layers of semiconductor material 72A-72D may be responsive to differing ranges of wavelengths of electromagnetic radiation.

Optionally, a buffer layer 76 may be provided between the first layer of semiconductor material 72A and the second layer of semiconductor material 72B, between the second layer of semiconductor material 72B and the third layer of semiconductor material 72C, between the third layer of semiconductor material 72C and the fourth layer of semiconductor material 72D, and between the fourth layer of semiconductor material 72D and the first electrode 56, as shown in FIG. 4.

The device 70 may further comprise another layer of semiconductor material 74, which may or may not be formed using nanoparticles fabricated using embodiments of methods of the present invention. For example, the layer of semiconductor material 74 may comprise a layer of semiconductive oxide material (e.g., ZnO or $TiO_2$), which, optionally, may be porous in some embodiments. Furthermore, another buffer layer (not shown) optionally may be provided between the layer of semiconductor material 74 and the first layer of semiconductor material 72A.

Depending on the composition and configuration of the different material layers of the device 70 shown in FIG. 4, the device 70 may comprise a diode (e.g., a light emitting diode (LED)), a photovoltaic device, a radiation sensor, a solid-state laser device, or another semiconductor device.

Figure 5:
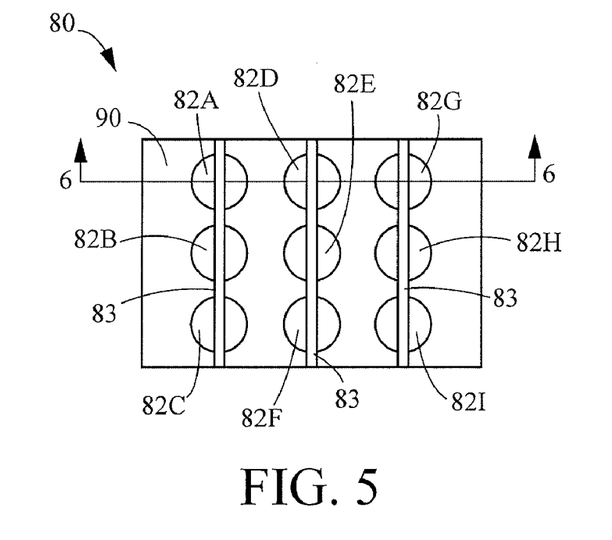
FIG. 5 is a simplified plan view of another embodiment of a semiconductor device of the present invention that may be formed using particles fabricated using the systems and methods described with reference to FIG. 1.
Figure 6:
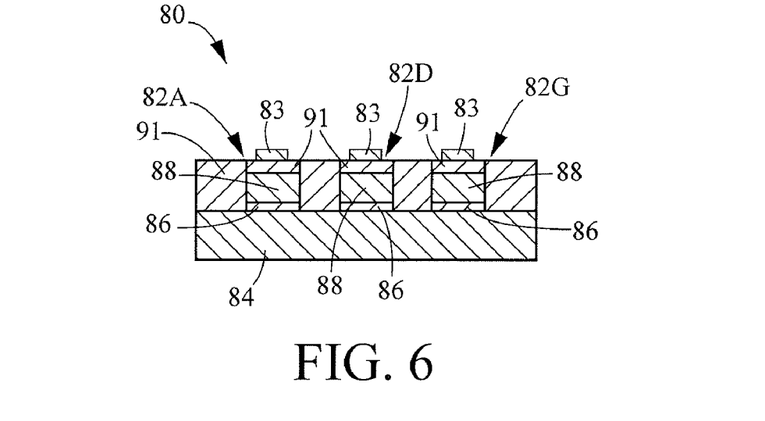
FIG. 6 is a simplified cross-sectional view of the semiconductor device shown in FIG. 5 taken along section line 6-6 therein illustrating different layers thereof.

Yet another embodiment of a semiconductor device 80 of the present invention is shown in FIGS. 5 and 6. Referring to FIG. 5, the device 80 may comprise a plurality of spatially separated and discrete active regions. The device 80 shown in FIGS. 5 and 6, which has been simplified for purposes of illustration of FIG. 5, includes nine (9) active regions 82A, 82B, 82C, ... 82I. In actuality, however, the device 80 may comprise any number (e.g., tens, hundreds, thousands, millions, etc.) of active regions. Each active region 82A-82I may be surrounded by a dielectric material 90 that is electrically insulative. As a non-limiting example, the layer of dielectric material 90 may comprise $SiO_2$.

Referring to FIG. 6, the device 80 may comprise a conductive layer 84 (which may or may not be formed on another substrate). The conductive layer 84 may comprise an at least substantially continuous layer of conductive material like those previously described in relation to the first electrode 56 shown in FIGS. 2 and 3. Each active region 82A-82I comprises a finite volume of active material 88 formed using nanoparticles fabricated by embodiments of methods of the present invention, as previously described in reference to FIG. 1. Electrical contact may be provided between each volume of active material 88 and the conductive layer 84. Each volume of active material 88 may comprise, for example, a plurality of nanoparticles each comprising a semiconductor material (e.g., $CuInS_2$). In other embodiments, each volume of active material 88 may comprise a substantially unitary structure formed by annealing or otherwise bonding together a plurality of nanoparticles.

Each active region 82A-82I optionally may comprise a buffer layer 86 between the conductive layer 84 and the volume of active material 88. A conductive plug 91 may be provided over each of the volumes of active material 88, and each conductive plug 91 may be in electrical contact with one or more conductive lines or traces 83. The conductive lines or traces 83 may extend to other circuitry and electrical components (not shown) of the device 80. In this configuration, each volume of active material 88 may be disposed between, and electrically coupled to each of, the conductive layer 84, which may function as a first electrode, and a conductive line or trace 83, which may serve as a second electrode.

In some embodiments, the volume of active material 88 of one or more active regions 82A-82I of the device 80 may differ from the volume of active material 88 of one or more other active regions 82A-82I in one or more physical and/or chemical characteristics.

As one non-limiting example, the volumes of active material 88 of the active regions 82A-82I may be formed using nanoparticles having differing chemical compositions. By way of example and not limitation, the volumes of active material 88 of the active regions 82A-82C may comprise nanoparticles having a first chemical composition, the volumes of active material 88 of the active regions 82D-82F may comprise nanoparticles having a second chemical composition that differs from the first chemical composition, and the volumes of active material 88 of the active regions 82G-82I may comprise nanoparticles having a third chemical composition that differs from the first and second chemical compositions.

As another non-limiting example, the volumes of active material 88 of the active regions 82A-82I may be formed using nanoparticles having differing average particle sizes. By way of example and not limitation, the volumes of active material 88 of the active regions 82A-82C may be formed using nanoparticles having an average particle size of about three nanometers (3 nm), the volumes of active material 88 of the active regions 82D-82F may be formed using nanoparticles having an average particle size of about five nanometers (5 nm), and the volumes of active material 88 of the active regions 82G-82I may be formed using nanoparticles having an average particle size of about seven nanometers (7 nm). In this configuration, different active regions 82A-82I may be responsive to differing ranges of wavelengths of electromagnetic radiation.

Depending on the composition and configuration of the different material layers of the device 80 shown in FIGS. 5 and 6, the device 80 may comprise a diode (e.g., a light emitting diode (LED)), a photovoltaic device, a radiation sensor, a solid-state laser device, or any other semiconductor device.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the scope of the invention as defined by the following appended claims and their legal equivalents.

What is claimed is:

1. A method for fabricating particles, the method comprising:
    subjecting a single source precursor to $CO_2$;
    decomposing the single source precursor in the $CO_2$; and
    forming a plurality of particles from one or more products of the decomposition of the single source precursor;
    wherein forming the plurality of particles comprises forming a plurality of particles each comprising a chalcopyrite material.

2. The method of claim 1, wherein subjecting a single source precursor to $CO_2$ comprises subjecting a single source precursor to supercritical $CO_2$.

3. The method of claim 1, wherein forming a plurality of particles comprises forming a plurality of nanoparticles.

4. The method of claim 1, wherein forming a plurality of particles each comprising a chalcopyrite material comprises forming a plurality of particles each comprising a ternary chalcopyrite material.

5. The method of claim 1, further comprising dissolving at least one product of the decomposition of the single source precursor in the $CO_2$.

6. The method of claim 1, further comprising adding at least one of an alkane thiol and an alkane polythiol to the single source precursor.

7. The method of claim 1, further comprising selecting the single source precursor from the group consisting of [bis(ethanethiolato)indium]bis[μ-(ethanethiolato)]bis(triisobutylphosphine)-copper; [bis(ethanethiolato)indium]bis[μ-(ethanethiolato)]bis(trihexylphosphine)-copper; [bis(ethanethiolato)indium]bis[μ-(ethanethiolato)]bis(triphenylphosphine)-copper; [bis(ethanethiolato)indium]bis[μ-(ethanethiolato)]bis(perfluorotriphenylphosphine)- copper; [bis(propanethiolato)indium]bis[µ-(propanethiolato)]bis(triisobutylphosphine)-copper; [bis(propanethiolato)indium]bis[µ-(propanethiolato)]bis(trihexylphosphine)-copper; [bis(propanethiolato)indium]bis[µ-(propanethiolato)]bis(triphenylphosphine)-copper; [bis(propanethiolato)indium]bis[µ-(propanethiolato)]bis(perfluorotriphenylphosphine)-copper; [bis(hexanethiolato)indium]bis[µ-(propanethiolato)]bis(triisobutylphosphine)-copper; [bis(hexanethiolato)indium]bis[µ-(propanethiolato)]bis(trihexylphosphine)-copper; [bis(hexanethiolato)indium]bis[µ-(propanethiolato)]bis(triphenylphosphine)-copper; [bis(hexanethiolato)indium]bis[µ-(propanethiolato)]bis(perfluorotriphenylphosphine)-copper; [bis(4-trifluoromethyl-thiophenolato)indium]bis[µ-(4-trifluoromethylthiophenolato)]bis(triisobutylphosphine)-copper; [bis(4-trifluoromethyl-thiophenolato)indium]bis[µ-(4-trifluoromethyl-thiophenolato)]bis(trihexylphosphine)-copper; [bis(4-trifluoromethyl-thiophenolato)indium]bis[µ-(4-trifluoromethyl-thiophenolato)]bis(triphenylphosphine)-copper; [bis(4-trifluoromethyl-thiophenolato)indium]bis[µ-(4-trifluoromethyl-thiophenolato)]bis(perfluorotriphenylphosphine)-copper; [bis(3,5-bis(trifluoromethyl)-thiophenolato)indium]bis[µ-(3,5-bis(trifluoromethyl)-thiophenolato)]bis(triisobutylphosphine)-copper; [bis(3,5-bis(trifluoromethyl)-thiophenolato)indium]bis[µ-(3,5-bis(trifluoromethyl)-thiophenolato)]bis(trihexylphosphine)-copper; [bis(ethanethiolato)Gallium]bis[µ-(ethanethiolato)]bis(triisobutylphosphine)-copper; [bis(ethanethiolato)Gallium]bis[µ-(ethanethiolato)]bis(trihexylphosphine)-copper; [bis(ethanethiolato)Gallium]bis[µ-(ethanethiolato)]bis(triphenylphosphine)-copper; [bis(ethanethiolato)Gallium]bis[µ-(ethanethiolato)]bis(perfluorotriphenylphosphine)-copper; [bis(propanethiolato)Gallium]bis[µ-(propanethiolato)]bis(triisobutylphosphine)-copper; [bis(propanethiolato)Gallium]bis[µ-(propanethiolato)]bis(trihexylphosphine)-copper; [bis(propanethiolato)Gallium]bis[µ-(propanethiolato)]bis(triphenylphosphine)-copper; [bis(propanethiolato)Gallium]bis[µ-(propanethiolato)]bis(perfluorotriphenylphosphine)-copper; [bis(hexanethiolato)Gallium]bis[µ-(propanethiolato)]bis(triisobutylphosphine)-copper; [bis(hexanethiolato)Gallium]bis[µ-(propanethiolato)]bis(trihexylphosphine)-copper; [bis(hexanethiolato)Gallium]bis[µ-(propanethiolato)]bis(triphenylphosphine)-copper; [bis(hexanethiolato)Gallium]bis[µ-(propanethiolato)]bis(perfluorotriphenylphosphine)-copper; [bis(4-trifluoromethyl-thiophenolato)Gallium]bis[µ-(4-trifluoromethyl-thiophenolato)]bis(triisobutylphosphine)-copper; [bis(4-trifluoromethyl-thiophenolato)Gallium]bis[µ-(4-trifluoromethyl-thiophenolato)]bis(trihexylphosphine)-copper; [bis(4-trifluoromethyl-thiophenolato)Gallium]bis[µ-(4-trifluoromethyl-thiophenolato)]bis(triphenylphosphine)-copper; [bis(4-trifluoromethyl-thiophenolato)Gallium]bis[µ-(4-trifluoromethyl-thiophenolato)]bis(perfluorotriphenylphosphine)-copper; [bis(3,5-bis(trifluoromethyl)-thiophenolato)Gallium]bis[µ-(3,5-bis(trifluoromethyl)-thiophenolato)]bis(triisobutylphosphine)-copper; [bis(3,5-bis(trifluoromethyl)-thiophenolato)Gallium]bis[µ-(3,5-bis(trifluoromethyl)-thiophenolato)]bis(trihexylphosphine)-copper; [bis(3,5-bis(trifluoromethyl)-thiophenolato)Gallium]bis[µ-(3,5-bis(trifluoromethyl)-thiophenolato)]bis(triphenylphosphine)-copper; [bis(3,5-bis(trifluoromethyl)-thiophenolato)Gallium]bis[µ-(3,5-bis(trifluoromethyl)-thiophenolato)]bis(perfluorotriphenylphosphine)-copper; [bis(ethanethiolato)indium]bis[µ-(ethanethiolato)]bis(triisobutylphosphine)-silver; [bis(ethanethiolato)indium]bis[µ-(ethanethiolato)]bis(trihexylphosphine)-silver; [bis(ethanethiolato)indium]bis[µ-(ethanethiolato)]bis(triphenylphosphine)-silver; [bis(ethanethiolato)indium]bis[µ-(ethanethiolato)]bis(perfluorotriphenylphosphine)-silver; [bis(propanethiolato)indium]bis[µ-(propanethiolato)]bis(triisobutylphosphine)-silver; [bis(propanethiolato)indium]bis[µ-(propanethiolato)]bis(trihexylphosphine)-silver; [bis(propanethiolato)indium]bis[µ-(propanethiolato)]bis(triphenylphosphine)-silver; [bis(propanethiolato)indium]bis[µ-(propanethiolato)]bis(perfluorotriphenylphosphine)-silver; [bis(hexanethiolato)indium]bis[µ-(propanethiolato)]bis(triisobutylphosphine)-silver; [bis(hexanethiolato)indium]bis[µ-(propanethiolato)]bis(trihexylphosphine)-silver; [bis(hexanethiolato)indium]bis[µ-(propanethiolato)]bis(triphenylphosphine)-silver; [bis(hexanethiolato)indium]bis[µ-(propanethiolato)]bis(perfluorotriphenylphosphine)-silver; [bis(4-trifluoromethyl-thiophenolato)indium]bis[µ-(4-trifluoromethyl-thiophenolato)]bis(triisobutylphosphine)-silver; [bis(4-trifluoromethyl-thiophenolato)indium]bis[µ-(4-trifluoromethyl-thiophenolato)]bis(trihexylphosphine)-silver; [bis(4-trifluoromethyl-thiophenolato)indium]bis[µ-(4-trifluoromethyl-thiophenolato)]bis(triphenylphosphine)-silver; [bis(4-trifluoromethyl-thiophenolato)indium]bis[µ-(4-trifluoromethyl-thiophenolato)]bis(perfluorotriphenylphosphine)-silver; [bis(3,5-bis(trifluoromethyl)-thiophenolato)indium]bis[µ-(3,5-bis(trifluoromethyl)-thiophenolato)]bis(triisobutylphosphine)-silver; [bis(3,5-bis(trifluoromethyl)-thiophenolato)indium]bis[µ-(3,5-bis(trifluoromethyl)-thiophenolato)]bis(trihexylphosphine)-silver; [bis(3,5-bis(trifluoromethyl)-thiophenolato)indium]bis[µ-(3,5-bis(trifluoromethyl)-thiophenolato)]bis(triphenylphosphine)-silver; [bis(3,5-bis(trifluoromethyl)-thiophenolato)indium]bis[µ-(3,5-bis(trifluoromethyl)-thiophenolato)]bis(perfluorotriphenylphosphine)-silver; [bis(ethanethiolato)gallium]bis[µ-(ethanethiolato)]bis(triisobutylphosphine)-silver; [bis(ethanethiolato)gallium]bis[µ-(ethanethiolato)]bis(trihexylphosphine)-silver; [bis(ethanethiolato)gallium]bis[µ-(ethanethiolato)]bis(triphenylphosphine)-silver; [bis(ethanethiolato)gallium]bis[µ-(ethanethiolato)]bis(perfluorotriphenylphosphine)-silver; [bis(propanethiolato)gallium]bis[µ-(propanethiolato)]bis(triisobutylphosphine)-silver; [bis(propanethiolato)gallium]bis[µ-(propanethiolato)]bis(trihexylphosphine)-silver; [bis(propanethiolato)gallium]bis[µ-(propanethiolato)]bis(triphenylphosphine)-silver; [bis(propanethiolato)gallium]bis[µ-(propanethiolato)]bis(perfluorotriphenylphosphine)-silver; [bis(hexanethiolato)gallium]bis[µ-(propanethiolato)]bis(triisobutylphosphine)-silver; [bis(hexanethiolato)gallium]bis[µ-(propanethiolato)]bis(trihexylphosphine)-silver; [bis(hexanethiolato)gallium]bis[µ-(propanethiolato)]bis(triphenylphosphine)-silver; [bis(hexanethiolato)gallium]bis[µ-(propanethiolato)]bis(perfluorotriphenylphosphine)-silver; [bis(4-trifluoromethyl-thiophenolato)gallium]bis[µ-(4-trifluoromethyl-thiophenolato)]bis(triisobutylphosphine)-silver; [bis(4-trifluoromethyl-thiophenolato)gallium]bis[µ-4-trifluoromethyl-thiophenolato)]bis(trihexylphosphine)-silver; [bis(4-trifluoromethyl-thiophenolato)gallium]bis[µ-(4-trifluoromethyl-thiophenolato)]bis(triphenylphosphine)-silver; [bis(4-trifluoromethyl-thiophenolato)gallium]bis[µ-(4-trifluoromethyl-thiophenolato)]bis(perfluorotriphenylphosphine)-silver; [bis(3,5-bis(trifluoromethyl)-thiophenolato)gallium]bis[µ-(3,5-bis(trifluoromethyl)-thiophenolato)]bis(triisobutylphosphine)-silver; [bis(3,5-bis(trifluoromethyl)-thiophenolato)gallium]bis[µ-(3,5-bis(trifluoromethyl)-thiophenolato)]bis (trihexylphosphine)-silver; [bis(3,5-bis(trifluoromethyl)-thiophenolato)gallium]bis[μ-(3,5-bis(trifluoromethyl)-thiophenolato)]bis(triphenylphosphine)-silver; and [bis(3,5-bis(trifluoromethyl)-thiophenolato)gallium]bis[μ-(3,5-bis(trifluoromethyl)-thiophenolato)]bis(perfluorotriphenylphosphine)-silver.

8. A method for fabricating particles, the method comprising:
  subjecting a single source precursor to $CO_2$;
  adding at least one of an alkane thiol and an alkane polythiol to the single source precursor;
  decomposing the single source precursor in the $CO_2$; and
  forming a plurality of particles from one or more products of the decomposition of the single source.

9. A method for fabricating particles, the method comprising:
  subjecting a single source precursor to supercritical fluid;
  decomposing the single source precursor in the supercritical fluid; and
  forming a plurality of particles from one or more products of the decomposition of the single source precursor;
  wherein forming the plurality of particles comprises forming a plurality of particles each comprising a chalcopyrite material.

10. The method of claim 9, wherein forming a plurality of particles comprises forming a plurality of nanoparticles.

11. A method for fabricating nanoparticles of ternary chalcopyrite material, the method comprising:
  subjecting a single source precursor to supercritical $CO_2$;
  decomposing the single source precursor in the supercritical $CO_2$; and
  forming a plurality of nanoparticles each comprising a ternary chalcopyrite material from one or more products of the decomposition of the single source precursor.

12. The method of claim 11, wherein subjecting a single source precursor to supercritical $CO_2$ comprises flowing supercritical $CO_2$ through an enclosure containing the single source precursor.

13. The method of claim 11, wherein subjecting the single source precursor to supercritical $CO_2$ comprises subjecting $((i\text{-}C_4H_9)_3P)_2Cu(C_2H_5S)_2In(C_2H_5S)_2$ to the supercritical $CO_2$, and wherein forming a plurality of nanoparticles each comprising a ternary chalcopyrite material comprises forming a plurality of nanoparticles each comprising $CuInS_2$.

14. The method of claim 13, wherein subjecting $((i\text{-}C_4H_9)_3P)_2Cu(C_2H_5S)_2In(C_2H_5S)_2$ to the supercritical $CO_2$ comprises subjecting $((i\text{-}C_4H_9)_3P)_2Cu(C_2H_5S)_2In(C_2H_5S)_2$ to supercritical $CO_2$ at a pressure greater than about twenty megapascals (20.0 MPa) and a temperature greater than about sixty-six degrees Celsius (66° C.).

15. The method of claim 11, wherein forming a plurality of nanoparticles further comprises forming a plurality of nanoparticles having an average diameter of less than about fifteen nanometers (15 nm).

16. The method of claim 15, wherein forming a plurality of nanoparticles having an average diameter of less than about fifteen nanometers (15) further comprises forming a plurality of nanoparticles having an average diameter of less than about three (3) nanometers.

17. The method of claim 11, wherein subjecting a single source precursor to supercritical $CO_2$ comprises:
  providing the single source precursor in a container; and
  flowing the supercritical $CO_2$ through the container.

18. The method of claim 11, further comprising:
  providing the single source precursor in a container;
  providing a substrate within the container; and
  forming the plurality of nanoparticles on the substrate within the container.

19. The method of claim 18, wherein providing a substrate within the container comprises at least one of providing a layer of substrate material within the container and providing a plurality of substrate particles within the container.

20. The method of claim 19, wherein providing a substrate within the container comprises providing a porous substrate within the container, and wherein forming the plurality of nanoparticles on the substrate comprises forming at least some nanoparticles of the plurality of nanoparticles in pores of the porous substrate.

* * * * *

UNITED STATES PATENT AND TRADEMARK OFFICE
CERTIFICATE OF CORRECTION

PATENT NO. : 8,003,070 B2
APPLICATION NO. : 12/047956
DATED : August 23, 2011
INVENTOR(S) : Robert V. Fox, Rene G. Rodriguez and Joshua Pak It is certified that error appears in the above-identified patent and that said Letters Patent is hereby corrected as shown below:

On the title page:
In ITEM (56) References Cited:
    OTHER PUBLICATIONS
    Page 2, $2^{nd}$ column, $2^{nd}$ line of the
        $24^{th}$ entry (line 71),      change "Applications,"Progress" to
        --Applications," Progress--

In the claims:
CLAIM 7,    COLUMN 18, LINE 57,    change "bis[µ-4-trifluorornethyl-" to
    --bis[µ-(4-trifluoromethyl--
CLAIM 8,    COLUMN 19, LINE 14,    change "the single source." to
    --the single source precursor.--

Signed and Sealed this
Twenty-second Day of September, 2015

Michelle K. Lee
*Director of the United States Patent and Trademark Office*